United States Patent [19]

Sotolongo

[11] Patent Number: 4,460,232
[45] Date of Patent: Jul. 17, 1984

[54] JUNCTION BOX FOR SOLAR MODULES

[75] Inventor: Thomas J. Sotolongo, Clearwater Beach, Fla.

[73] Assignee: AMP, Incorporated, Harrisburg, Pa.

[21] Appl. No.: 381,106

[22] Filed: May 24, 1982

[51] Int. Cl.³ .............................................. H01R 9/16
[52] U.S. Cl. ............................ 339/122 R; 339/116 C; 339/154 A
[58] Field of Search ............. 136/244, 256; 339/91 R, 339/176 R, 184 R, 184 M, 186 R, 186 M, 176 M, 122 R, 154 R, 154 A, 155 R, 156 R, 157 R, 158, 159 R, 159 C, 116 C

[56] References Cited

U.S. PATENT DOCUMENTS

| 4,310,211 | 1/1982 | Bunnell et al. | 339/91 R |
| 4,313,646 | 2/1982 | Millhimes et al. | 339/156 R |
| 4,336,418 | 6/1982 | Hoag | 339/122 R |

Primary Examiner—John McQuade
Attorney, Agent, or Firm—F. Brice Faller

[57] ABSTRACT

Junction box for connecting plug members to two discrete bus bars in a solar module comprises a dielectric housing which is mounted on the module over tabs connected to respective bus bars. Housing has a pair of integral dielectric receptacle members having terminal members therein having planar blade portions which are engaged by plug members inserted in the receptacles. Terminals each have planar bus terminating portion parallel to floor of housing over aperture in floor which receives tabs therethrough.

1 Claim, 6 Drawing Figures

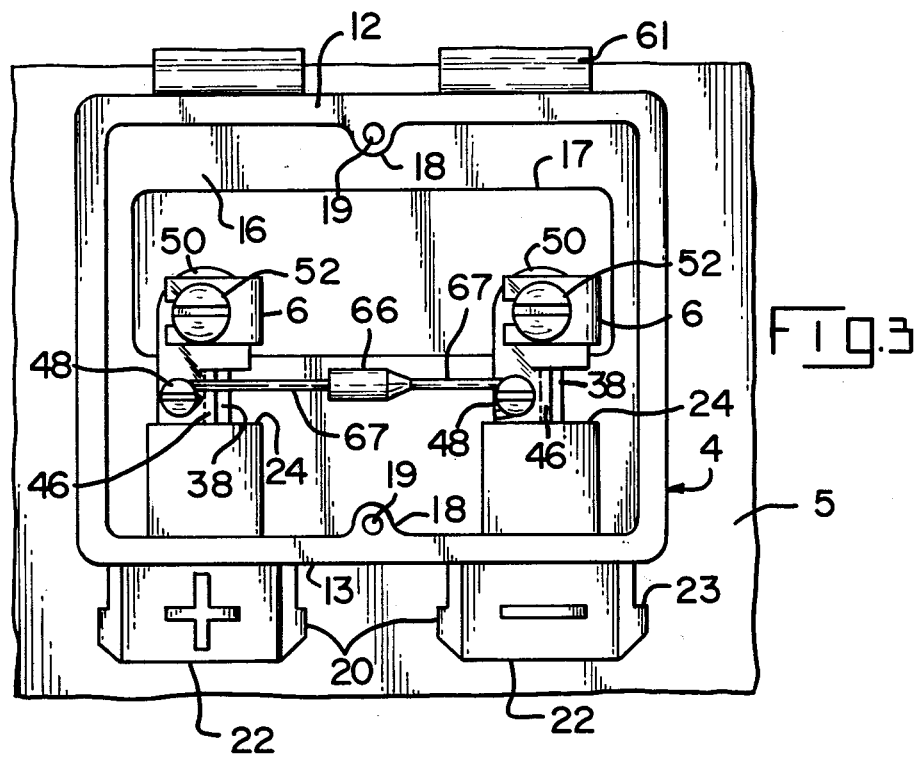
Fig. 3
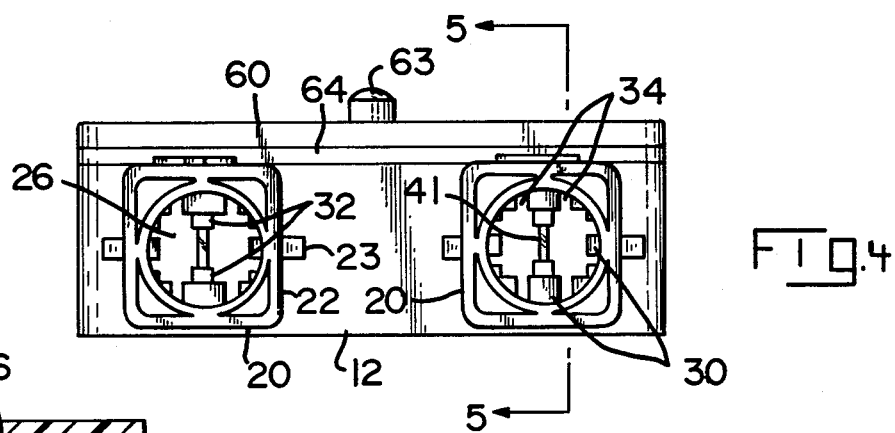
Fig. 4
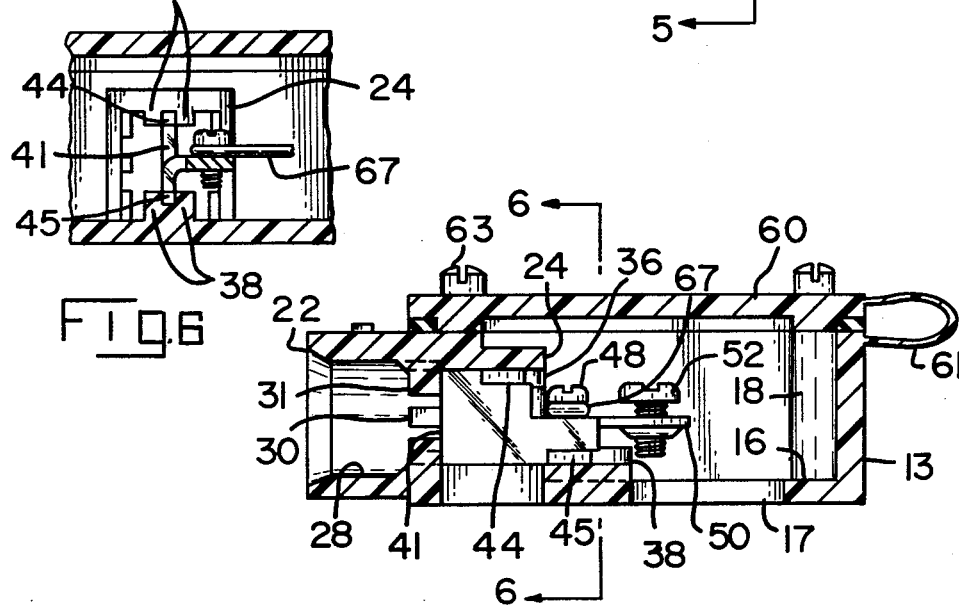
Fig. 6
Fig. 5

1

JUNCTION BOX FOR SOLAR MODULES

BACKGROUND OF THE INVENTION

The present invention relates to an electrical connector for photovoltaic modules and particularly to a junction box therefor.

Modules made up of photovoltaic cells are used to assemble larger scale solar panels and require ready means for interconnecting the modules so that they can be replaced. Modules generate a voltage drop across the cells therein and thus must have connecting means for both positive and negative sides of the drop. U.S. Pat. No. 4,310,211 discloses a contact system for solar modules which utilizes individual receptacle members which are fit onto exposed tine members of a respective bus bar in a solar module. The receptacle member receives a plug member having a terminal therein with a pair of resilient arms which engage the tine. The contact system disclosed in U.S. Pat. No. 4,310,211 would require a pair of receptacles to be fixed in each module, and tines sturdy enough to act as terminals. A desirable alternative would be a junction box which would receive two plugs of the type disclosed in U.S. Pat. No. 4,310,211, insofar as these are already in use in the industry. A standard metal junction box with two receptacles screwed into threaded openings has been manufactured, but requires three discrete components which must be assembled.

SUMMARY OF THE INVENTION

The present invention is directed to a junction box in the form of a one-piece molded plastic housing having a pair of integral receptacles. Each receptacle has a bore therethrough which communicates between the inside and outside of the housing. The box incorporates two stamped and formed metal terminal members, each having a planar blade end which is fitted into the respective bore from the end of the receptacle inside the housing and a bus terminating end which lies over an aperture in the floor of the housing. Each terminal member is formed with lances which have an interference fit between a pair of ribs in the receptacle and a pair or ribs on the floor of the housing. The housing is intended to be secured to a solar module so that a pair of flexible metal tabs which are fixed to respective bus bars in the module may pass through the aperture and be terminated to the bus terminating ends of respective terminal members by means of screws. Each bore is profiled to receive a plug in the end of the receptacle outside the housing. The plug is of the type disclosed in U.S. Pat. No. 4,310,211, which is hereby incorporated by reference.

BRIEF DESCRIPTION OF THE DRAWINGS

FIG. 3 is a plan view of the junction box mounted on the module.

FIG. 4 is an end view of the junction box.

FIG. 5 is a side sectional view of the junction box taken along line 5—5 of FIG. 4.

FIG. 6 is a sectional view of the inner end of a receptacle taken along line 6—6 of FIG. 5.

DETAILED DESCRIPTION OF THE PREFERRED EMBODIMENT

Figures 1, 2:
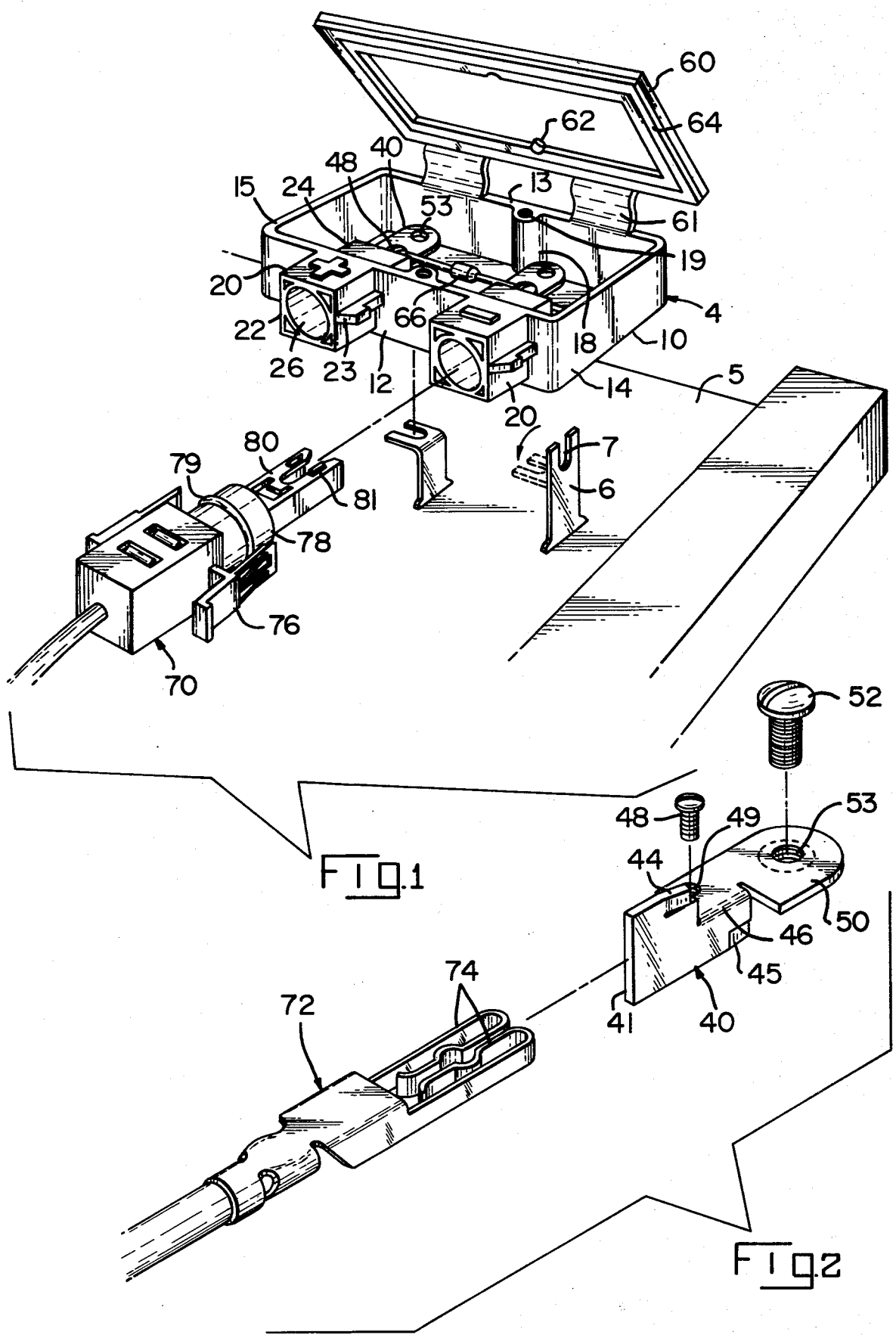
FIG. 1 is a perspective of the junction box and plugs exploded from a solar module.
FIG. 2 is a perspective of the contact member used in the junction box and the contact member of the plug.

FIG. 1 shows the junction box 4 of the present invention exploded from a solar module 5. The tabs 6 are preferably flexible copper sheet and are fixed to positive and negative buses within the module by soldering during the manufacture thereof. The junction box 4 has an aperture 17 in the floor 16 thereof which receives the tabs 6 when the box 4 is fixed to the module. The tabs 6 are subsequently bent over terminals 40 in the box 4 so that slots 7 align with threaded holes 53. The most salient feature of the junction box 4 is housing 10, which comprises opposed first and second endwalls 12, 13, opposed first and second sidewalls 14, 15, and floor 16. Receptacles 20 are integral with first endwall 12 and each have bores 26 therethrough from outer end 22 to inner end 24. Each bore 26 is profiled with features as well be described and each retains a portion of a terminal 40 therein toward inner end 24. Each bore 26 receives a plug 70 at the outer end 22 of receptacle 20; the plug 70 comprises a cylindrical section 78 having an annular sealing ring 79 thereon and a rectangular extension 80 having keys 81 thereon, which in an alternative embodiment extend the length of extension 80. Similar keys are present on the opposite side of the rectangular extension. Latches 76 on the plug 70 latch with latches 23 on the receptacles 20 as the cylindrical section 78 is pushed home in the bore 26. Other salient features are the diode 66 connected to terminals 40 and cover 60 which is molded integrally with housing 10 and attached thereto by hinges 61. The cover 60 carries a gasket 64 about the periphery thereof which presses against the tops of walls 12, 13, 14, 15 when the cover 60 is fixed to the housing by means of screws passing through holes 62 and engaging threaded bores 19 in screw receiving posts 18. The housing 10 and cover 60 are molded of a temperature resistant plastic such as nylon.

FIG. 2 depicts the electrical contact elements in the plug 70 and receptacle 20. Terminal 72 is fixed in plug 70 and has a pair of resilient arms 74 which engage the blade end 41 of terminal 40, which is located in the receptacle 20 as will be described. The terminal 40 is stamped and formed from brass and has lances 44, 45 struck therefrom as shown which serve to secure the terminal to the receptacle 20, and further is formed with a right angle bend 46 midway which connects the blade end 41 to the bus terminating end 50 such that the two ends 41, 50 lie in perpendicular planes parallel to the longitudinal axis of the terminal 40. The terminal 40 has a tapped hole 49 which receives screw 48 for terminating a diode in addition to tapped hole 53 which receives screw 52 for terminating a tab 6.

FIG. 3 is a plan view of the junction box 4 as fixed to a solar panel 5, sans cover 60 (FIG. 1). The terminals 40 have been fitted into receptacles 20 from the inside end 24 such that the lance 45 (FIG. 2) fits between pairs of ribs 38 (only one rib of each pair visible in FIG. 3). The ribs 38 extend between the inner end 24 and aperture 17 in the floor 16 of the housing. Tabs 6 have been terminated to the bus terminating ends 50 by screws 52 and the diode 66 has opposed leads 67 which have been terminated to the midportions of terminals 40 by screws 48. Screw receiving posts 18 having threaded bores 19 are integral with the endwalls 13, 14.

FIG. 4 is an end view of the junction box 4 looking at endwall 12 into profiled bores 26 in the outer ends 22 of receptacles 20. Stops 32 serve to limit travel of the cylindrical section 78 of plug member 70 while stops 32 serve to limit travel of blade end 41 from the inside. The rectangular extension 80 of plug member 70 fits between stops 30 to engage terminal 41 as keys 81 slide into keyways 34. The spacing of the keys 81 and keyways 34 assures that a positive polarity plug 70 will not be inserted into a negative polarity receptacle.

FIG. 5 is a section view showing a terminal 40 as fully inserted in the inner end 24 of receptacle 20. Lance 44 is located between a pair of retaining ribs 36 at the inner end of the receptacle 20 and lance 46 is locked between retaining ribs 38, as also depicted in FIG. 6. The bore 26 extends from outer end 22 to inner end 24 and has a cylindrical entry section 28 which accommodates the cylindrical portion 78 of plug member 70 (FIG. 1). Stops 30 limit plug travel while stops 31 limit the travel of blade end 41. Note that bus terminating end 50 of terminal 40 lies over aperture 17 to facilitate termination to tabs 6 (FIG. 1).

In an alternative embodiment of the invention, the cover 60 is made of aluminum or other metal and has a planar rib perpendicular to the plane of the cover on the surface of the cover facing the housing 10. The rib is in a plane parallel to the sidewalls 14, 15 and carries a diode mounted in a hole through the rib, the diode having flexible leads which are attached to terminals 40 by screws 48 or 52 prior to fixing the cover 60 to the box 4. The cover thus acts as a heat sink for the diode. Heat dissipation properties of the cover may be enhanced by provision of integral metal cooling fins on the surface opposite the housing 10.

I claim:

1. A junction box for mounting on a photovoltaic solar module, said junction box providing means for connecting plug members to two discrete bus bars in said solar module, said junction box comprising:

a dielectric housing having a floor, opposed first and second endwalls, and opposed first and second sidewalls, said floor having a planar external surface for mounting flush onto a solar module, said floor having aperture means for receiving connecting means attached to respective bus bars, first and second dielectric receptacle members integral with said first endwall of said housing, each said receptacle member having a profiled axial bore therethrough, the axis of said bore being parallel to said floor of said housing, first and second conductive terminal members having planar blade portions situated in the bores of respective receptacle members and planar bus terminating portions situated in said housing parallel to said floor over said aperture means, each said blade portion being in a plane perpendicular to the respective said bus terminating portion, said axis of each said bore lying parallel to the planes of both the bus terminating portion and the blade portion therein, whereby, said bus terminating portions may be connected to said connecting means when said planar external surface of said housing is fixed to said module with said connecting means extending through said aperture means, said blade portions being connectable to terminals in plug members profiled to fit in said axial bores.

* * * * *